United States Patent [19]

Cedrone

[11] Patent Number: 4,956,604
[45] Date of Patent: Sep. 11, 1990

[54] BROAD BAND CONTACTOR ASSEMBLY FOR TESTING INTEGRATED CIRCUIT DEVICES

[75] Inventor: Nicholas J. Cedrone, Wellesley Hills, Mass.

[73] Assignee: Daymarc Corporation, Waltham, Mass.

[21] Appl. No.: 312,437

[22] Filed: Feb. 17, 1989

Related U.S. Application Data

[63] Continuation of Ser. No. 88,894, Aug. 24, 1987, abandoned, which is a continuation of Ser. No. 660,475, Oct. 12, 1984, Pat. No. 4,689,556.

[51] Int. Cl.$^5$ .......................... G01R 31/28; H01P 5/00
[52] U.S. Cl. .................................. 324/158 F; 439/70; 439/264; 439/620; 439/912
[58] Field of Search ........... 324/158 P, 158 F, 73 PC; 439/70, 71, 525, 620, 260, 263, 264, 265, 912

[56] References Cited

U.S. PATENT DOCUMENTS

| | | | |
|---|---|---|---|
| 3,587,029 | 6/1971 | Knowles | 439/607 |
| 3,715,662 | 2/1973 | Richelmann | 324/158 F |
| 3,964,087 | 6/1976 | Mallon | 338/306 |
| 4,326,765 | 4/1982 | Brancaleone | 439/620 X |
| 4,356,532 | 10/1982 | Donaher et al. | 361/393 |
| 4,415,216 | 11/1983 | Narozny | 439/465 |
| 4,419,626 | 12/1983 | Cedrone et al. | 324/158 P |
| 4,428,633 | 1/1984 | Lundergan et al. | 439/620 X |
| 4,473,798 | 9/1984 | Cedrone et al. | 324/158 P |
| 4,478,472 | 10/1984 | Baar | 439/620 X |
| 4,519,658 | 5/1985 | Biswas | 439/68 |
| 4,560,216 | 12/1985 | Egawa | 439/41 |
| 4,564,251 | 1/1986 | Hansen | 439/71 |
| 4,675,599 | 7/1987 | Jensen et al. | 324/158 F |

FOREIGN PATENT DOCUMENTS 13350 1/1984 Japan.

OTHER PUBLICATIONS

Bry, A. et al., "Bypass Capacitor for Chip Probe", IBM Technical Disclosure Bulletin, vol. 18, No. 11, Apr., 1976, pp. 3629-3630.
Finerman, W. et al., "Test Socket for Use Where Electrical Interference is Critical", IBM Technical Disclosure Bulletin, vol. 17, No. 6, Nov. 1974, p. 1626.
Valentine, E. et al., "Conductive Epoxy Encapsulated Wafer Probe", IBM Technical Disclosure Bulletin, vol. 20, No. 11B, Apr. 1978, pp. 4797-4798.
Barkuff, E. et al., "Minicontact Probe for Testing Chips" IBM Technical Disclosure Bulletin, vol. 19, No. 2, Jul., 1976, p. 467, Motorola Semiconductors Brochure, MC 12071/CA 3179, undated.

Primary Examiner—Jerry Smith
Assistant Examiner—Stephen M. Baker
Attorney, Agent, or Firm—Wolf, Greenfield & Sacks

[57] ABSTRACT

A contactor assembly for testing electronic devices that are packaged with a dual-in-line pin array has an insulating base that mounts two rows of contacts, each adapted to flex into electrical connection with a pin of the device, and a pair of flexible ground planes each spaced closely from an associated one row of said contacts. A flexible, insulating spacer maintains the ground planes and their associated row of contacts with a substantially fixed spacing there between during the flexural movement of said contacts. In the preferred form, the upper edge of the ground planes adjacent the pins includes an arrangement for securing a chip electronic device, a capacitor or a resistor. The other end of the chip mounts a contact tip that makes electrical connection with an associated pin when the associated contact also connects with the pin. The signal path provided by the holder, chip and tip is extremely short, preferably less than 0.150 inch. The contacts and ground planes electrically surface mount on a contactor board. Flexible lower end portions of the contacts and ground planes make direct electrical connection with signal pads and ground planes on the board without the use of connectors. A flexible mount formed by strips of a conductive material having arms soldered to two or more contacts hold a surge capacitor that decouples the device from ground noise during large current surges.

6 Claims, 4 Drawing Sheets

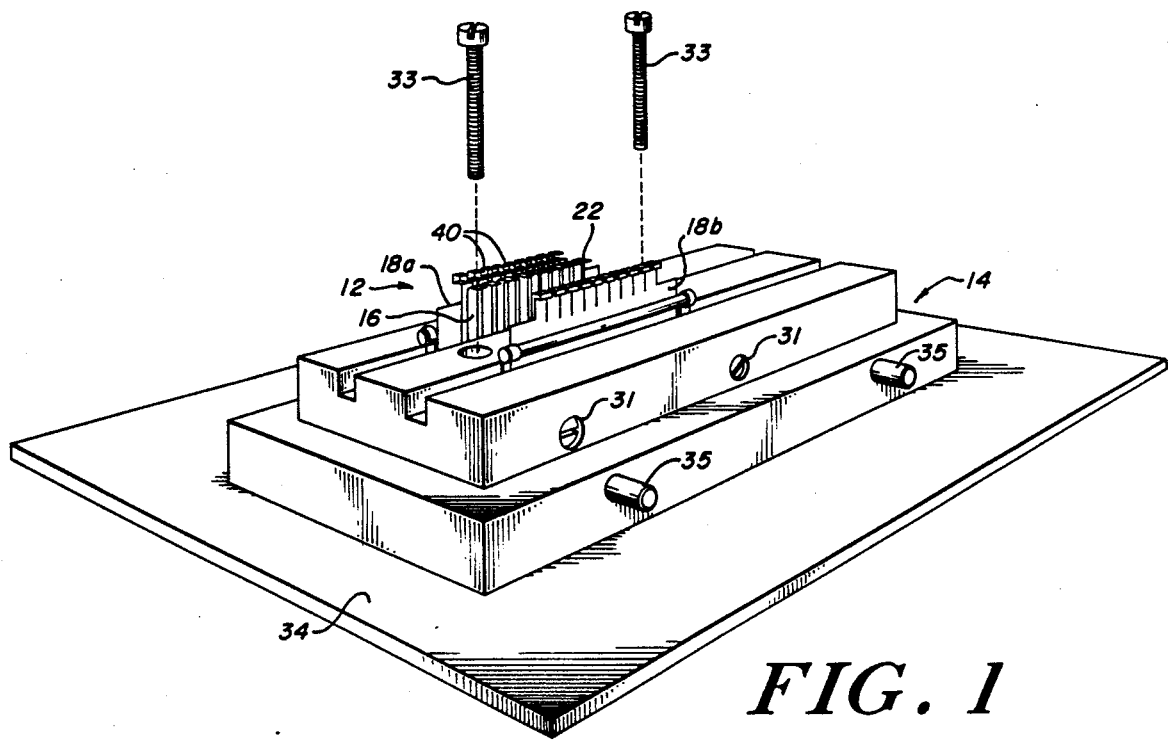
FIG. 1
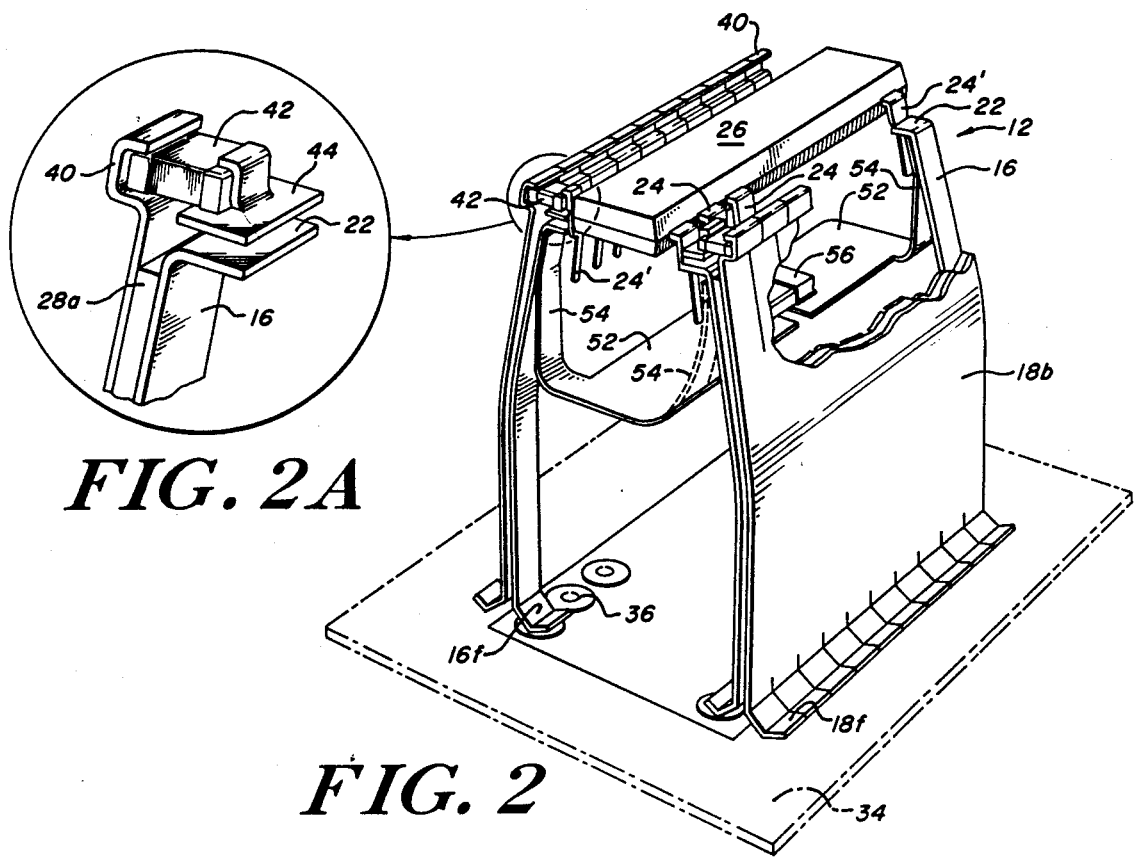
FIG. 2A
FIG. 2

BROAD BAND CONTACTOR ASSEMBLY FOR TESTING INTEGRATED CIRCUIT DEVICES

This application is a continuation of application Ser. No. 088,894, filed Aug. 24, 1987, abandoned which is a continuation of Ser. No. 660,475, filed Oct. 12, 1984, now U.S. Pat. No. 4,689,556.

BACKGROUND OF THE INVENTION

This invention relates in general to testing apparatus for electronic devices. More specifically it relates to a contactor assembly that is generally frequency insensitive to allow broad band testing of integrated circuits with fast-rising signals and has a connection and mounting system that is reliable and easy to use.

In the manufacture and use of integrated circuits (IC's) and similar electronic devices it is important to test the devices accurately, reliably and at a high rate. Automatic testing and handling apparatus machines that can perform this task are available. Such apparatus suitable for testing dual-in-line packaged (DIP) IC's are sold by the Daymarc Corporation, Waltham, Mass., under the trade designation Types 1157 and 757. In a DIP device, the circuit is contained in a molded plastic body having a generally rectangular, box-like configuration. Two rows of generally parallel connecting pins are arrayed along parallel sides of the body with each pin extending in a direction generally normal to the main faces of the body.

In each of the aforementioned apparatuses the IC's are momentarily brought to rest at a test station where a set of contacts, typically double Kelvin contacts, are flexed by a push bar action into electrical connection with the pins of the device under test (DUT). The contacts establish an electrical connection between testing circuitry and the device. The contacts are usually part of a probe or contactor assembly which includes an insulating base member that mounts the contacts. The contacts are typically narrow strips of a resilient and highly conductive material. The contacts typically make electrical connection with an associated connecting pin at a free end opposite the base. The cross-sectional dimensions of the contacts are relatively small due to (1) the requirement that all of the contacts simultaneously make connection with a set of closely packed pins and (2) the requirement that the contacts flex for millions of cycles of operation without material fatigue. The length of the contacts is determined by the spacing between the test station of the IC handling apparatus and the test circuitry.

Frequently the testing of the integrated circuits requires that the testing signal be "fast-rising", that is, a signal which is a very steep, step-like increase in potential. A typical fast-rising signal is characterized by a voltage change of 5 volts per nanosecond. Such a signal can be represented through Fourier analysis as being composed of a multitude of superimposed sine waves having a very high frequency, typically on the order of 300 MHz. The fast-rising signal launched by the test circuitry and carried by the contacts to the device therefore contains components with very high frequencies.

A major problem with this testing arrangement is that due to the inherent inductance of the contacts themselves, the signal encounters an inductive reactance $X_L$. This reactance produces distortions and reflections which degrade the quality and accuracy of the test. The inductance L of the contact is a function of the cross-sectional area of the conductor and its length. Inductance increases directly with the length and inversely with the cross-sectional area. Since the inductive reactance $X_L = 2\pi f L$, for the very high frequencies f associated with a fast-rising signal, the inductive reactance associated with even the relatively short contacts in normal use becomes a significant source of distortion and limits the accuracy of measurements.

One possible solution would be to increase the cross-sectional area of the contacts. However, the physical constraints of the test environment limit the useful dimensions of the contacts. For example, the contacts must be separated laterally from adjacent contacts while still maintaining a unique association with one pin on the IC. Also, the contacts must be sufficient thin to flex repeatedly without exhibiting fatigue. Another possible solution is to make the contacts shorter. This solution works well if the IC can be placed manually into the test circuit. However, with high speed automated operation (e.g. 6,000 units per hour), the test circuitry must be physically separated from the device handling mechanisms with electrical connection made over some short distance spanned by a probe or contactor assembly of the type described above. In short, modern production economics require contacts having a length which is troublesome for fast-rising signals. Another possible solution is simply to test each device more slowly to wait for distortions and reflections to die out. With many modern IC's, however, the speed of operation of the device itself is so fast that if the testing operation were to extend over a sufficient period of time to allow distortions and echoes induced by the fast-rising testing signal to subside, then the speed rating of the devices cannot be determined. In short, the testing operation must have a speed comparable to that of the device function being tested.

Another consideration is minimizing "ground noise", that is, changes in the reference voltage due to current surges during the test procedure simulating operation of the device. A typical situation is a test where a change in the device state causes a current surge in the range of 20 milliamperes per nanosecond. Such a surge can cause the ground reference to move 1 volt or more thereby distorting measurements referenced to ground by 20% or more. The end result is that good devices may not pass the test and are downgraded.

Another problem with testing apparatuses for electronic devices exists in the way the probe or contactor assemblies are connected to a test circuit. When there is a high density of electrical contacts in a confined area, it is difficult to make connections with the testing circuitry while maintaining signal fidelity. The use of connectors typically introduces discontinuities which introduce reflections.

The interface assembly taught by Daymarc Corporation's U.S. Pat. No. 4,473,798 is one type of connection that avoids this disadvantage. It provides the necessary high density, characteristic impedance multiple electrical connections to multiple contacts and ground plates. It uses interchangeable contactor assemblies replaceably mounted on contactor boards. A pattern of conductive stripes is carried on at least one face of the board. Elastomeric connectors with narrow, mutually spaced apart conductive filaments electrically connect the stripes with the contacts and plates of the contactor assembly. The contactor board is clamped to the test contactor assembly at its rear surface to establish a unique electrical connection between each conductive stripe and an associated contact or plate.

While this interface assembly offers a much improved flexibility over prior connectors, under factory operating conditions there has been some difficulty in maintaining the conductive stripes of the elastomeric connectors aligned with the conductive stripes of the contactor board. It is also significant that the contactor assembly is assembled to the contactor board from the rear side and then mounted on a handler. The test circuit is then brought up and connected to the contactor board. With this arrangement, after the electrical connections through the board and the contactor assembly are tested, signal lines must be broken and re-established in order to operate the test system with a test/handler.

A further problem with the contactor assembly described in the aforementioned Daymarc '798 patent as well as U.S. Pat. No. 4,419,626 is that while a surge capacitor is connected across two pins in parallel with the device being tested to provide power-ground decoupling for fast-rising current surges, this location is far enough removed from the device that significant ground noise remains. Also, in certain test situations it is desirable to be able to connect certain pins to one another during the test so that they are at the same potential and otherwise are in the same electrical condition. With existing contactor assemblies, there has been no convenient way to short out two or more DUT pins over a short signal path that will not itself introduce reflections and distortions, particularly where the test signal has very high frequency components.

In U.S. Pat. Nos. 4,419,626 and 4,473,798, assigned to the assignee of the present invention, a contactor assembly is disclosed which is capable of testing electronic devices including high-speed ICs, without presenting significant inductive reactance to a fast-rising signal launched in any contact of the assembly. This test contactor assembly includes at least one row of flexible contacts which are secured at one end to an insulated base. A conductive plate, also secured to the base, extends to a generally parallel, closely spaced relationship to each row of contacts. The dimensions of the plate and its spacing from the associated contacts produce a distributed capacitance with respect to each contact in the row so that a fast-rising test signal launched in a contact encounters a purely resistive or "characteristic" impedance that is frequency independent.

While the contactor assembly of U.S. Pat. No. 4,419,626 gives excellent electrical performance, it does not solve the problem of reflections and distortions produced at the connection between the contact and a pin of the IC, nor does it isolate the signal on one contact from electrical distrubances produced by changes in the electrical state of the DUT. The test signal is transmitted to the device over the contacts which have a preselected "characteristic" impedance, typically in the range of 50 to 100 ohms. If the device is a 50 ohm device and the characteristic impedance of the contacts is also 50 ohms, then the transition from the contactor assembly to the device is smooth. If, on the other hand, the device has a high impedance, then the transition from a 50 ohm contactor assembly to the device results in signal reflections and signal oscillation. With this system, the device under test cannot be decoupled adequately from the test fixture and the quality of the signal seen by the device becomes uncertain. This reduces the reliability of the test.

It is also quite important to note that ideally a test fully simulates the electronic and physical environment that the DUT is likely to encounter when it is eventually used as a component of a circuit. Existing test systems have not been able to fully duplicate actual use conditions, in part because they have not been able to produce connections in a high speed test environment where a DUT pin is connected to ground over a very short signal path, as is often the case in an actual circuit, which may include capacitive or resistive circuit elements. Another shortcoming of existing contactor assemblies is that characteristic or matched impedance signal lines usually terminate in an impedance mismatch, not the characteristic impedance. It is desirable to be able to terminate a signal line in the characteristic impedance (e.g. 50 ohms) to substantially eliminate signal reflections. It is also important, if one wishes to simulate a variety of end-use circuit environments, to be able to vary the electronic test characteristics at selected DUT pins, that is, to configure and reconfigure the test environment readily and in the field. Prior art contactor assemblies do not provide this capability while also meeting the other desired operating characteristics enumerated above.

It is therefore a principal object of the present invention to provide an improved characteristic impedance contactor assembly for testing electronic devices.

Another significant object is to provide an improved contactor that decouples, or terminates in the characteristic impedance, individual pins of the device under test (DUT) through an electrical path length which is equivalent to the distance recommended for a final operative circuit for the device.

Another object of the invention is to provide this decoupling or termination in the characteristic impedance selectively at a pin or pins of the device under test.

Another object is to provide power-ground coupling that is solder connected, low impedance and close to the device.

Another object of the invention is to provide a contactor assembly that electrically connects to a contactor or DUT board with a high degree of reliability and convenience and eliminates connectors or soldering.

Yet another object of the invention is to provide a contactor assembly that surface mounts to a contactor or DUT board from its front side adjacent the device under test so that testing of the contactor assembly to board connections does not require that signal lines be broken and then re-established to begin production testing of devices.

Another object is to provide a contactor assembly where a power-ground plane can serve as a shorting bar between two or more pins.

A further object is to provide a contactor assembly that can be field configured, or reconfigured, to the testing requirements of a device under test and which can be field maintained.

Another object of the invention is to provide a contactor assembly with the foregoing advantages that has a generally simple, low cost, and highly durable construction.

SUMMARY OF THE INVENTION

A contactor assembly for electronic devices, particularly dual-in-line packaged (DIP) IC's with two parallel rows of connecting pins, has an insulating base that supports at least one row of resilient electrical contacts.

A distinctive feature of the present invention is that the lower ends of these contacts pass through the base and terminate in flexible end portions which are designed to make electrical connection with signal pads of a test circuit board. In a preferred form the flexible end portions, or "feet," are bent into a V-shaped configuration and the signal pads are in direct connection with plated through holes that reach an internal conductive strip uniquely associated with that signal pad, and hence that contact. The upper ends of the contact extend in a generally perpendicular direction from the base, and these upper ends are typically angled toward an associated pin to make electrical connection with the pin when the contact is flexed toward the device. Each contact has small cross section that is designed to conduct an electrical signal along its length between test circuitry and the device being tested. Each contact is structured to flex resiliently from a first non-testing position where the upper end of the contact is spaced from its associated pin to a second testing position where the upper end is forced into electrical connection with the pin.

The base also supports a plate, which serves as a ground plane and which is associated with and oriented in a generally parallel, closely spaced relationship with respect to each row of the contacts. The spacing is preferably uniform and is maintained by a layer of flexible insulating material which is inserted between each of the rows of contacts and the associated plate. The plate is continuous and extends substantially the full length of the associated row. The plate terminates at its lower end in a plurality of flexible contacting end portions, preferably also V-shaped "feet", which make electrical connection to a conductive ground surface on the test board. The flexible feet and contactor board connection system allows the contactor assembly to be surface mounted on a "device under test"]or DUT board without additional connection elements and thus reduces signal distortion.

The relative dimensions of the contacts, the associated plates and the insulation layer are adjusted to produce a distributed capacitance as seen by a signal transmitted along the contacts. The value of the resulting capacitive reactance substantially offsets the inductive reactance produced by the self inductance of the contacts. As a result, a fast-rising signal launched in a contact encounters a substantially characteristic impedance.

A principal feature of the present invention is that the upper end of the plate terminates in a plurality of chip holders which are designed to secure one end of a small chip capacitor or resistor. The opposite end of each chip mounts a contact tip that makes electrical connection with an associated pin of the device being tested. In the preferred form, a holder is associated with each of the contacts of the contactor assembly. With this holder-chip contact tip structure any DUT pin can be terminated to ground through the chip over a path that is typically less than 0.150 inch.

A further feature of the contactor assembly of this invention is a system for mounting a surge capacitor very near the device and in parallel between two diagonally opposite power pins, or between groups of pins. The mounting system includes two strips of a flexible conductive material that are suspended just below the device by a pair of arms or multiple arms that are soldered or otherwise secured to the contacts associated with the power pins. The strips are separated from one another with the surge capacitor bridging them. In the implementations illustrated, the strips are virtually in one plane, however, the strips can be in multiple planes with the chip capacitor forming the connection between the planes.

These and other features and objects of the invention will be more clearly understood from the following detailed description of the preferred embodiments which should be read in light of the accompanying drawings.

BRIEF DESCRIPTIONS OF THE DRAWINGS

FIG. 1 is a perspective view of the contactor assembly of the present invention mounted to a contactor board;

FIG. 2 is a perspective view of the contactor assembly shown in FIG. 1 with its contacts and ground plates flexed into electrical connection with the pins of an IC;

FIG. 2A is a detail of one chip device, its holder formed integrally with a ground plane, and a contact tip;

DETAILED DESCRIPTION OF THE PREFERRED EMBODIMENT

Figure 3:
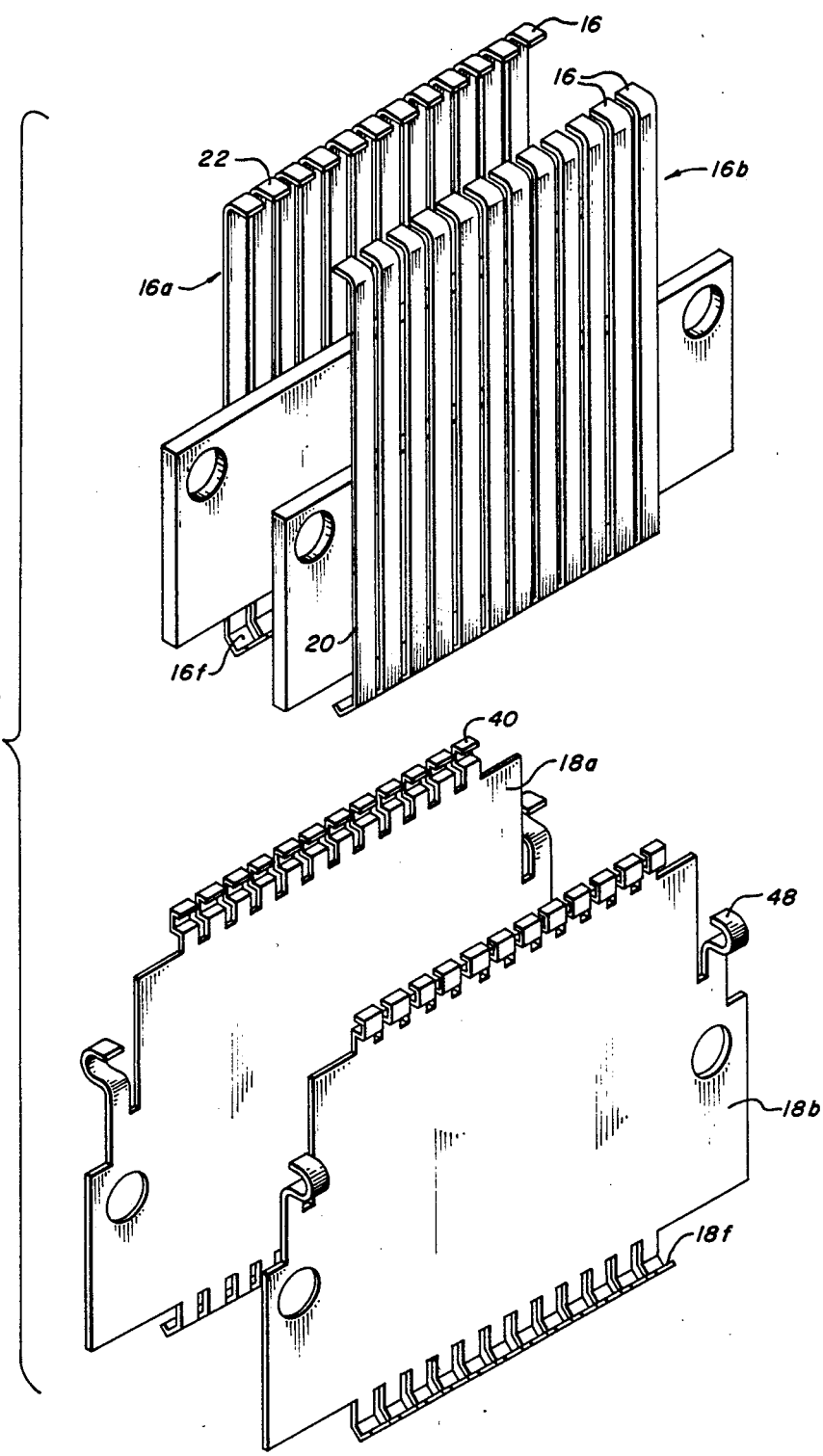
FIG. 3 is an exploded perspective view of the contacts ground plates and inner spacers of the contactor shown in FIGS. 1 and 2.

FIGS. 1–4 show a test contactor assembly 12 having two rows 16a, 16b of contacts 16 and a pair of conductive plates 18a, 18b which each serve as a ground plane 18. For the purpose of this description, the plates and rows of contacts are taken as being vertically oriented. Each plane 18 is associated with one row of contacts 16. Each contact 16 extends through a longitudinal slot 27 in a base 14. An upper end 22 of each contact 16 is angled toward an associated pin 24 of an integrated circuit (IC) 26. A lower end of each contact 16 terminates in a V-shaped "foot" 16f. The lower end of each plate 18 terminates in a plurality of longitudinally spaced V-shaped "feet" 18f. Each plane 18 preferably includes the same number of feet 18f as the number of contacts 16 with which the plane 18 is associated. The cross-section of each contact 16 is preferably generally rectangular with the broad face of each contact parallel to the pins 24.

Figure 5:
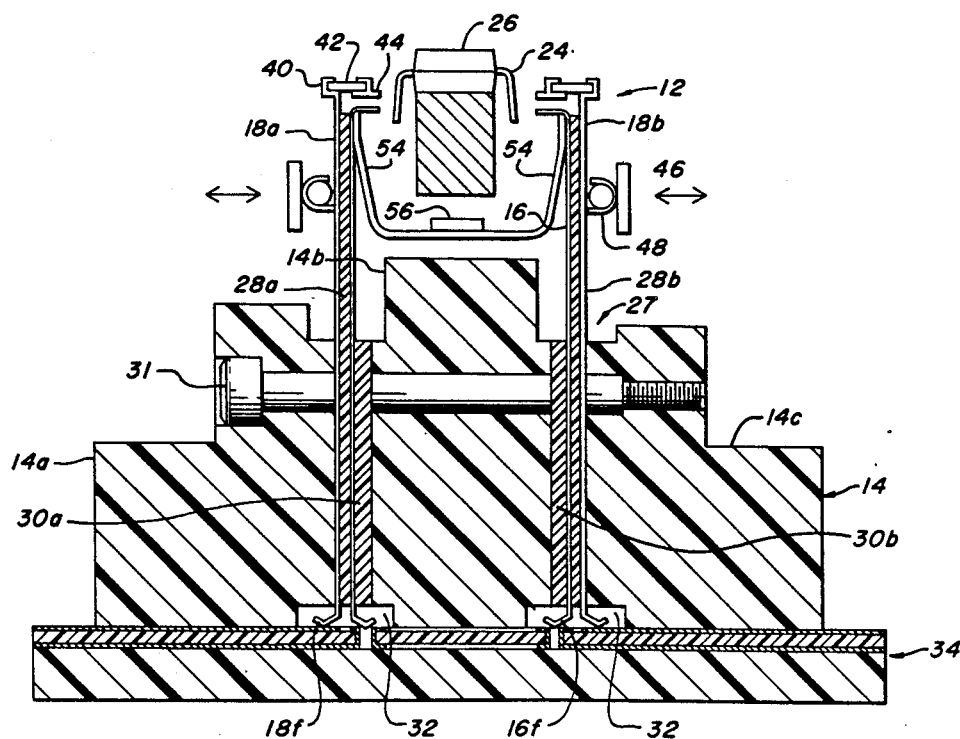
FIG. 5 is a view in vertical section of the contactor assembly shown in FIG. 2.

The base 14, which is most clearly shown in FIG. 5, includes the openings 27 that receive the contacts 16 and the planes 18. Within the openings 27, the lower ends 20 of the contacts 16 are spaced from their associated plane 18 by flexible insulating strips 28a, 28b made of materials such as fluoroplastic which extend substantially along the entire height of the contacts 16. Insulating strips 30a, 30b which extend from the lower end 20 of the contacts 16 to the upper end of the base 14, space the contacts 16 from the base 14 and clamp the contacts and plates in the desired vertical orientation when screws 31,31 pass through the contactor assembly and thread into holes in a portion 14c of the base 14. A mirror image base portion 14a lies on the opposite side of the contacts and ground plates. A middle portion 14b sets the spacing between the contact rows 16a and 16b.

Figure 8:
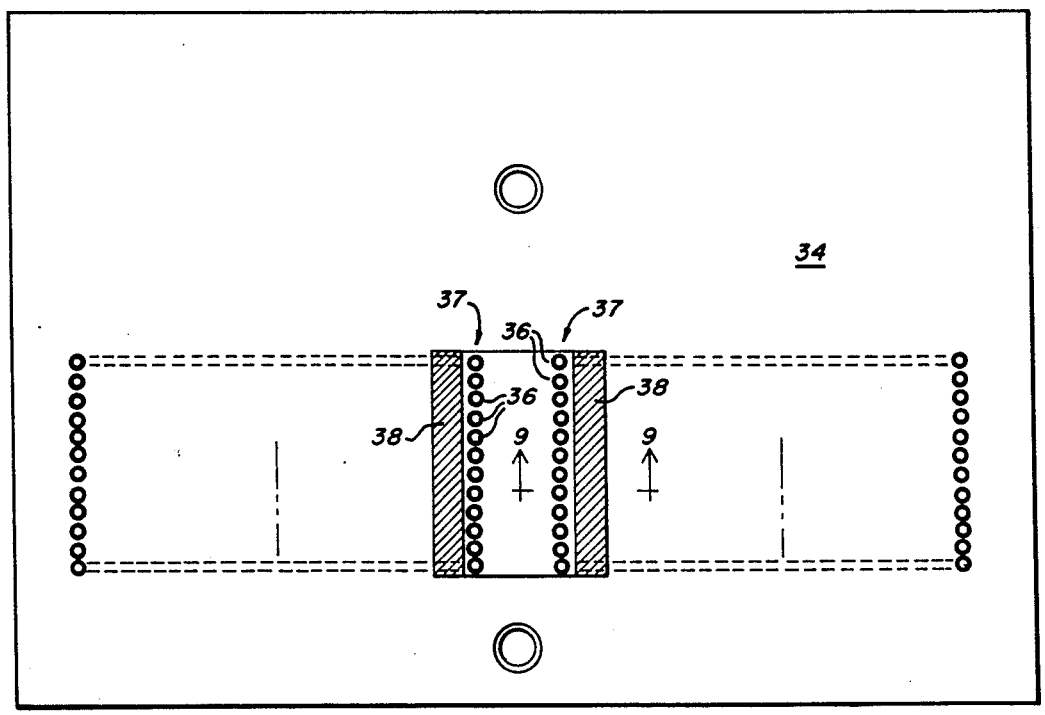
FIG. 8 is a top plan view of the contactor board shown in FIG. 1.
Figure 9:
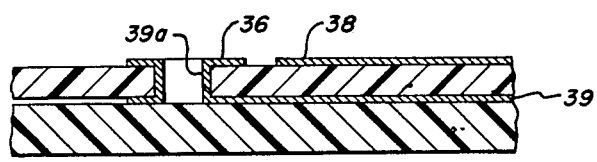
FIG. 9 is a cross-sectional view taken along lines 9—9 of FIG. 8.

The base 14, which is preferably made from a structurally stable insulating material such as an epoxy fiberglass, has its rear or lower face abut a device under test (DUT) or "contactor" board 34. This board, one form of which is shown in FIGS. 8 and 9, includes a plurality of individual electrical signal pads 36 arrayed in two rows 37 contact regions 38 of a ground plane positioned adjacent, but spaced from, the rows 37. The lower end of the base 14 includes two longitudinally extending cavities 32,32 that each overlie one row 37 of the electrical signal pads 36 portion of one of the ground plane regions 38. The contacts 16 and planes 18 make contact with these electrical signal pads 36 through V-shaped feet 16f and 18f. The feet 16f are spaced from each adjacent foot 16f, each foot can connect with only one electrical signal pad 36. To connect to a test circuit, in one form illustrated, the signal pads each connect to a conductive strip 39 within the board through a plated through hole 39a of conventional construction. The internal conductive strips extend to other signal pads at the periphery of the board 34 to facilitate connection to a test circuit. Other arrangements, such as direct coaxial wires attached to conductive stripes, are also possible. What is significant is that with the present invention the contactor assembly mounts on a surface with signal pads, that the signal is brought to the pad on a matched impedance line, and that the system uses no connectors that can introduce signal distortions. It is also significant that once the contactor assembly, contactor board, and test circuit are assembled and electrically connected, they can be mounted on a test/handler as a unit without breaking signal lines. One mounting system, as illustrated, uses pins 35, 35 that project from the contactor assembly, locate the assembly on the test/handler, and are secured by cam plates (not shown).

The contacts 16 and the planes 18, as well as the electrical signal pad contacting feet 16f, 18f, are formed of a material which is resilient and resistant to material fatigue. In the preferred embodiment illustrated, the feet 16f, 18f initially extend in a generally vertical direction from the associated contact 16 or plane 18 and they terminate in the aforementioned V-shaped end. The V-shaped foot of the contact 16 is oriented in a direction opposite that of the free end of the corresponding foot 18f of the adjacent plane 18. This orientation enables the contacts 16 and the planes 18 to be placed in close proximity to each other while maintaining reliable electrical connections at the board 34.

As the contactor assembly 12 is mated to the electrical board by screws 33,33, the feet 16f contact the signal pads 36. As the screws are tightened, the feet 16f "flatten out" in the direction of their free end. This flexing or "flattening out" is controlled by the size of the cavities 32 in the base 14 in relation to the size of the fact 16f or 18f. If the cavities 32 are shallow, a larger compressive force is developed than with a deeper cavity.

Figure 4:
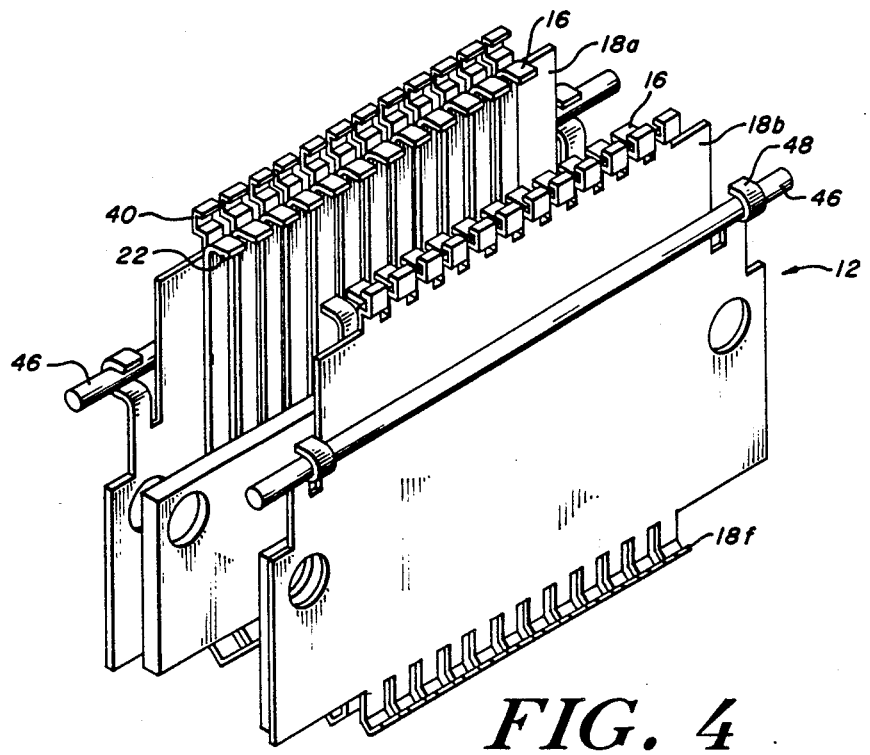
FIG. 4 is an unexploded perspective view of the contactor assembly shown in FIG. 3 but with the flex rods in place.
Figure 6:
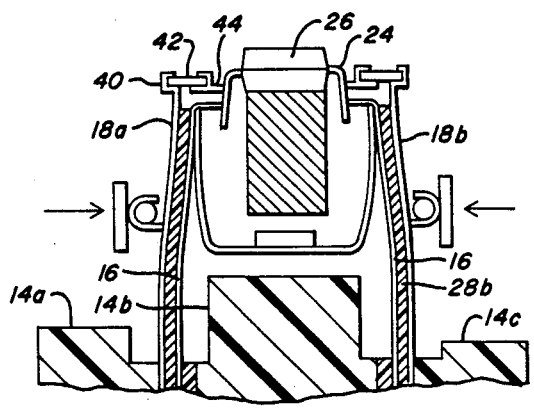
FIG. 6 is a simplified view in vertical section of the contactor assembly shown in FIG. 2.

In their normal unflexed position shown in FIGS. 1 and 3-4, the contacts 16 and planes 18 are generally perpendicular to the base 14. In this position, the ends 22 of the contacts are spaced from the pins 24. The contacts 16 and plane 18 are placed in the testing position (FIGS. 2 and 5-6) by a lateral force (typically delivered by a push bar) acting on insulating rods 46,46 which are held at the outer face of planes 18a,18b by rod supporting members 46. The planes 18 and insulating layers 28a,28b should therefore be sufficiently flexible so that they do not significantly impede flexural movement under the lateral force.

A row of mutually spaced apart, C-shaped chip holders 40 are formed on the upper end of plane 18. The number of holders 40 corresponds to the number of contacts 16 in a row. The holders 40, best seen shown in the inset of FIG. 2, include upper, lower and rear walls which secure a small chip capacitor or resistor 42 so that it extends from the pocket 40 towards a pin of the device being tested. The chip end is in electrical connection with the holder and is typically soldered. A connection member 44 fits on the opposite end of the chip 42 and is positioned to make electrical contact with a pin 24 of the device 26. The member 44 is substantially parallel to the end 22a of the contact 16 which contacts the IC being tested. The parts of contcts from row 16a and ground plane 18a are generally opposed to a like set of pairs of contacts from row 16b and ground plane 18b thereby allowing the contactor assembly 12 to make a reliable electrical connection to all of the pins of a DIP IC 26 of the type shown in FIGS. 2 and 3.

The chip device 42, when placed in contact with a pin 24 of the device 26 through the member 44, provides a minimum length path to ground. By installing a resistor of appropriate value, the signal line can be parallel terminated (the resistor can have the same resistance as the characteristic impedance provided by the contact 16 and its associated ground plane 18). This arrangement both delivers the signal to the device under test and eliminates reflections. By installing a chip capacitor of appropriate value, a substantially zero impedance to ground is provided for the high frequency components of signals on the DUT pin. The total signal path between a device pin and the ground plane is given by the length of the chip 42 and the contact tip 44, preferably less than 0.150 inch. This is a distinct improvement over termination of reflections and distortions of any known prior art contactor assemblies. With this structure, the length of the decoupling path is equivalent to the distance recommended for the IC in an operating circuit. Stated in other words, this short signal path to ground from the DUT pin allows the testing to very closely simulate the electronic environment of the chip in actual use in a circuit.

Figure 7:
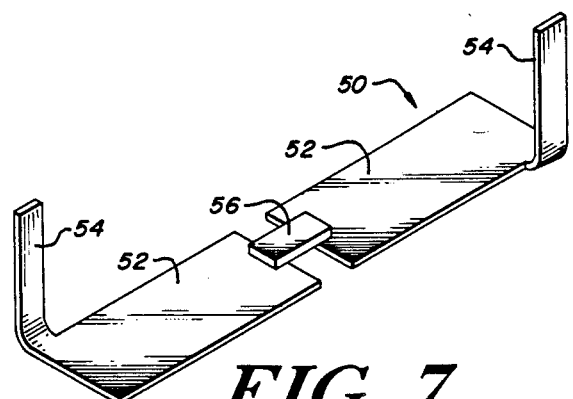
FIG. 7 is a detailed perspective view of the mounting system for the surge capacitor shown in FIGS. 2, 5 and 6.

Two power pins 24',24' of the IC are connected in parallel with a surge capacitor 56 through a flexible mounting assembly 50 (shown in FIGS. 2 6 and 7) which includes two strips 52 and with at least one integral, vertically extending arms 54. The two arms 54 shown in solid line FIG. 2 are soldered to the two power pins 24',24'. The other arm 54 shown in phantom in FIG. 2 indicates how several pins can be shorted through a strip 52 which then acts as a shorting bar. The strips 52 are spaced slightly from each other and bridged by the capacitor 56 which electrically connects the strips. The arms 54 are attached at their upper ends to associated contacts 16 (typically by soldering). This mount for the surge capacitor 56 enables the system to test the operation of an IC that causes a large current surge without inducing a signficant change in the ground reference voltage. An advantage of the above arrangement is that it provides a permanently attached ground decoupling for the devcie being tested of shorter path length and therefore of lower impedance than heretofore possible while accommodating the flexure movement of the contacts. This results in reductions in ground noise and increases the accuracy of the test results.

It is also significant that the contactor assembly is surface mounted to the DUT or contactor board 34 from the front of the contactor assembly, that is, the side adjacent the device 34 and opposite the board 34, and remains attached. With this arrangement, once a contactor assembly is mounted, it is not necessary to separate the contactor from the DUT board for installation into a test handler. Contactor, DUT board and test fixture remain an integral unit with contactor fitting over guide pins in the handler. A latch plate mounted on the handler locks the contactor in place. This in turn means that once signal lines are established, they are not broken and re-established as is the case with the contactor assembly and connection system described in the aforementioned Daymarc '626 and '798 patents.

While this invention has been described with reference to its preferred embodiments, it should be understood that various modfications and alterations will occur to those skilled in the art from the foregoing detailed description and the drawings. For example, while the connection arrangement described above uses the angled bottom portions of the contacts to make electrical connection with conductive portions of a multi-layer board, other arrangements may be used to connect a contact with an associated pad. Similarly, while the chip capacitors and resistors are described as mounted directly on the ground planes by holders, a variety of other mounting arrangements and electrical connection systems can be devised. Such modifications and variations are intended to fall within the scope of the appended claims.

What is claimed is:

1. In a contactor assembly for the high speed, automatic testing of first electronic devices (DUT's) that are packaged with a line of pins arrayed along at least one side of each of the DUT's where the contactor assembly includes a base formed of an insulating material and a plurality of elongated contacts mounted in said base and arrayed in at least one row with a first end of each contact positioned to make electrical connection with an associated pin of the DUT, said contacts being formed of a conductive material and being resiliently flexible to deform laterally from a first position where the first ends of the contact are spaced from the associated one of said pins to allow an unrestricted movement of the DUT through the contactor to and from a testing position to a second position where the first ends of the contacts make electrical connection with the associated pins when the DUT is in the testing position, the improvement comprising at least one second electronic device in electrical connection with the DUT through one or more selected pins where said second electronic device is in close physical proximity to the DUT during testing and disposed between the DUT and said base, the spacing between said DUT and said second device being substantially less than the length of said contacts, and resilient mounting means for said second electronic device which can accommodate the movement of said contacts between said first and second positions comprising at least two arms formed of a conductive material, each arm having a first portion secured to and in continuous electrical connection with selected one of said contacts near its first end so that it is in electrical connection with said contact when it is in both said first and said second positions, said first ends of said mounting means being movable with the associated contact between said first and said second positions and a second portion secured to and in continuous electrical connection with said second electronic device.

2. The improved contactor assembly of claim 1 wherein said second electronic device is a surge capacitor.

3. The improved contactor assembly of claim 2 wherein said at least two arms are each in electrical connection with power pins of said DUT.

4. The improved contactor assembly of claim 1 wherein said first and second arm positions are formed integrally of a resilient conductive material.

5. The improved contactor assembly of claim 1 wherein at least one of said arms has multiple first arm portions each electrically connected to an associated one of said pins.

6. The improved contactor assembly of claim 1 wherein said second arm portions lie in different planes.

* * * * *